United States Patent
Zhang et al.

(10) Patent No.: US 8,111,871 B2
(45) Date of Patent: Feb. 7, 2012

(54) MICROPHONE WITH PRESSURE RELIEF

(75) Inventors: Xin Zhang, Acton, MA (US); Michael W. Judy, Ipswich, MA (US); Kieran P. Harney, Andover, MA (US); Jason W. Weigold, Somerville, MA (US)

(73) Assignee: Analog Devices, Inc., Norwood, MA (US)

( * ) Notice: Subject to any disclaimer, the term of this patent is extended or adjusted under 35 U.S.C. 154(b) by 1053 days.

(21) Appl. No.: 12/015,903

(22) Filed: Jan. 17, 2008

(65) Prior Publication Data
US 2008/0175418 A1    Jul. 24, 2008

Related U.S. Application Data

(60) Provisional application No. 60/885,314, filed on Jan. 17, 2007.

(51) Int. Cl.
*H04R 11/02* (2006.01)
*G01L 9/00* (2006.01)

(52) U.S. Cl. ........................................ 381/423; 257/419
(58) Field of Classification Search .................. 381/337, 381/417, 423, 424; 438/52, 53; 257/415–419, 257/E29.324, E21.613
See application file for complete search history.

(56) References Cited

U.S. PATENT DOCUMENTS 5,146,435 A * 9/1992 Bernstein ...................... 367/181
2008/0212409 A1* 9/2008 Lutz .............................. 367/181

FOREIGN PATENT DOCUMENTS

WO   WO 02/15636 A2   2/2002
WO   WO 2006/123263 A1   11/2006

OTHER PUBLICATIONS

The International Search Report and the Written Opinion of the International Searching Authority, International Application No. PCT/US2008/051310, International Searching Authority, Jun. 16, 2008, 12 pages.

* cited by examiner

*Primary Examiner* — Calvin Lee
(74) *Attorney, Agent, or Firm* — Sunstein Kann Murphy & Timbers LLP

(57) ABSTRACT

A microphone has a movable diaphragm having a rest position, a stationary portion, and a set of springs movably coupling the diaphragm and the stationary portion. The diaphragm and stationary portion are spaced a first distance when the diaphragm is in the rest position. When not in the rest position, however, the diaphragm and stationary portion are capable of being spaced a second distance, which is greater than the first distance. Despite the change in distance, the diaphragm still is capable of returning the space from the second distance to the first distance when the diaphragm returns to the rest position.

24 Claims, 8 Drawing Sheets

MICROPHONE WITH PRESSURE RELIEF

CROSS-REFERENCE TO RELATED APPLICATIONS

The present application claims priority from U.S. provisional patent application Ser. No. 60/885,314 filed on Jan. 17, 2007 the full disclosure of which is hereby incorporated herein by reference.

FIELD OF THE INVENTION

The invention generally relates to microphones and, more particularly, the invention relates to microphone diaphragm robustness.

BACKGROUND OF THE INVENTION

Many types of microphones have a diaphragm that forms a variable capacitor with a stationary member. During use, an incident audio signal causes the diaphragm to move relative to the stationary member. Consequently, this movement changes the capacitance of the variable capacitor to produce an electronic signal representing the incident audio signal. Eventually, this electronic signal may be processed to reproduce the incident audio signal on a speaker.

Some microphones have a diaphragm that is movably connected with its underlying stationary member by means of a plurality of springs. For example, U.S. Pat. No. 5,146,435 shows such a microphone. Unlike microphones having diaphragms connected to the stationary member in a drum-like manner, this type of microphone is more prone to breaking due to the stresses concentrated in the springs. Specifically, rather than distributing the force around an entire peripheral connecting member, a spring-based microphone concentrates forces on relatively small areas (i.e., on the springs). As a result, when subjected to relatively high force events, such as high mechanical and/or acoustic shock events (e.g., door slam or jet engine), one or more springs can break, thus rendering the microphone unusable.

One solution to this problem is to use the drum-like diaphragm approach. Although it may be more robust, however, a drum-like diaphragm approach may not be a desirable configuration for other design reasons (e.g., sensitivity concerns).

SUMMARY OF THE INVENTION

In accordance with one embodiment of the invention, a microphone has a stationary portion having at least one internal recess. The microphone further includes a movable diaphragm having a rest position wherein at least a portion of the movable diaphragm resides within the internal recess when the movable diaphragm is in the rest position. A set of springs movably couples the diaphragm and the stationary portion. In response to a high force event, the diaphragm moves external to the internal recess creating a path for air to escape. The set of springs are capable of returning the diaphragm from its external position from the recess back to the rest position internal to the recess.

The set of springs may take on a variety of configurations and have varying numbers of springs (e.g., it can have two or more springs). For example, among other things, the set of springs may include at least one serpentine spring, at least one spring having a pressure relief feature, at least one spring having a varying width, and/or a generally straight spring.

The microphone may include a back plate that forms a capacitor with the diaphragm. An output signal may be created as a result of the diaphragm moving in response to an input audio signal.

The microphone may be embodied as micro-electro-mechanical system (MEMS) device wherein each of the components of the microphone are fabricated starting with a common silicon substrate using micromachining technology. The microphone chip may include electrical elements that are fabricated using integrated circuit manufacturing processes. In certain embodiments, the silicon may be single-crystal silicon. Additionally, the diaphragm may be formed from polysilicon. The back plate may also be formed from single-crystal silicon.

In one embodiment, the microphone chip includes a diaphragm that includes a first surface and at least one side. The diaphragm may be formed from polysilicon. The microphone chip includes a stationary portion having at least one side. The stationary portion may be part of a silicon substrate. Additionally, the microphone chip includes a plurality of springs coupled to the diaphragm and the stationary portion wherein a gap having a dimension exists between the side of the stationary portion and the side of the diaphragm. Additionally, the springs may extend increasing the dimension under a force presented by an audio input signal to the first surface of the diaphragm. The springs extend in a direction that is substantially perpendicular to the first side of the diaphragm. The microphone chip may also include a back plate that forms a capacitor with the diaphragm. The back plate may be formed from single crystal silicon. The capacitor creates an electrical output signal in response to an audio input signal. The back plate may have one or more holes that allow the audible input signal to pass there through and contact the diaphragm.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments of the invention, a microphone is configured so that its diaphragm remains intact when subjected to relatively high force events. To that end, a plurality of springs connecting the diaphragm to the substrate assist in forming an effective pressure relief valve that, during high force events, assists in relieving pressure within the microphone. Details of various embodiments are discussed below. Additionally, microphone maintains sensitivity while providing pressure relief for high force events.

Figure 1A:
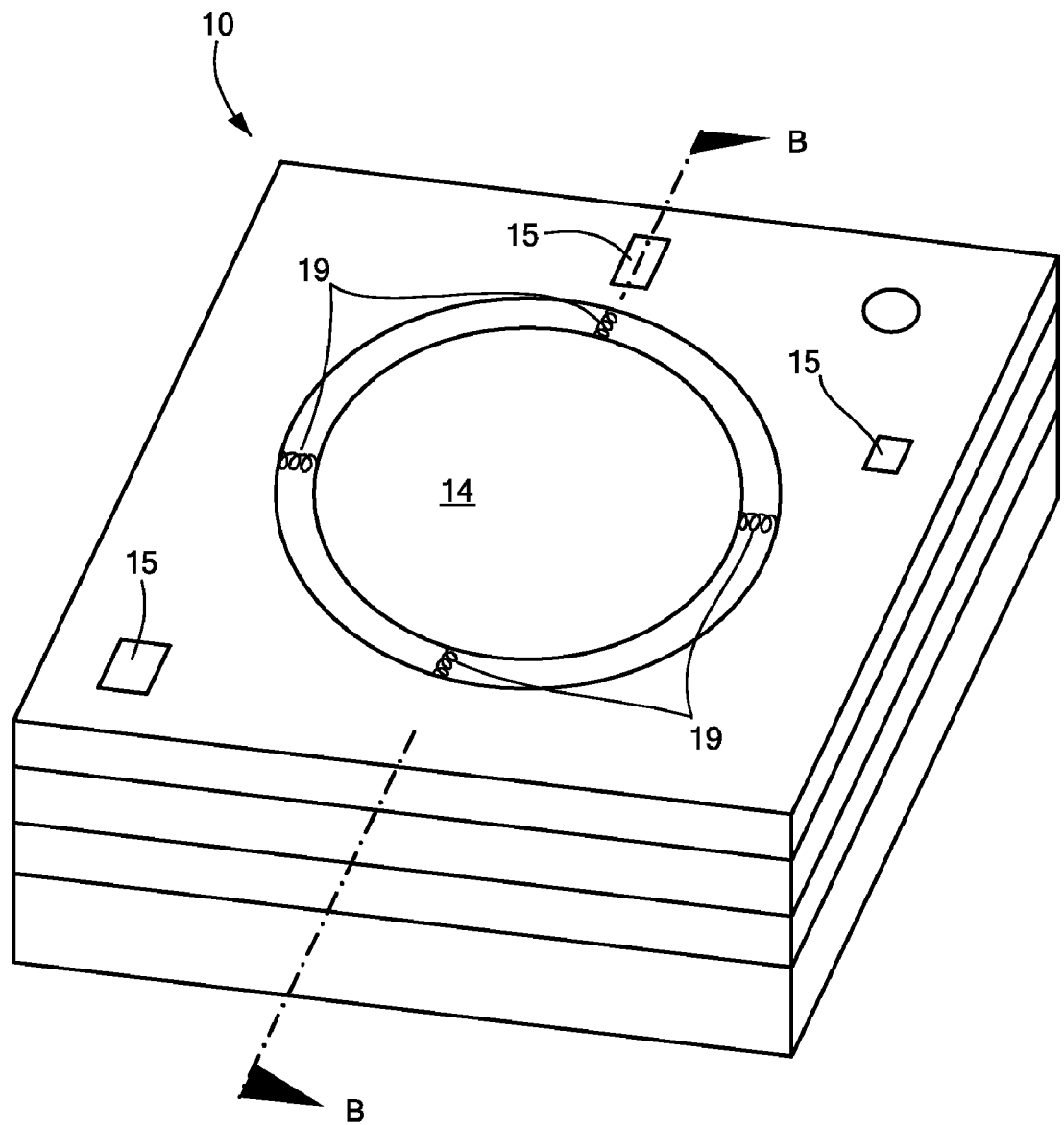
FIG. 1A schematically shows a top, perspective view of a microphone that may be fabricated in accordance with illustrative embodiments of the invention.
Figure 1B:
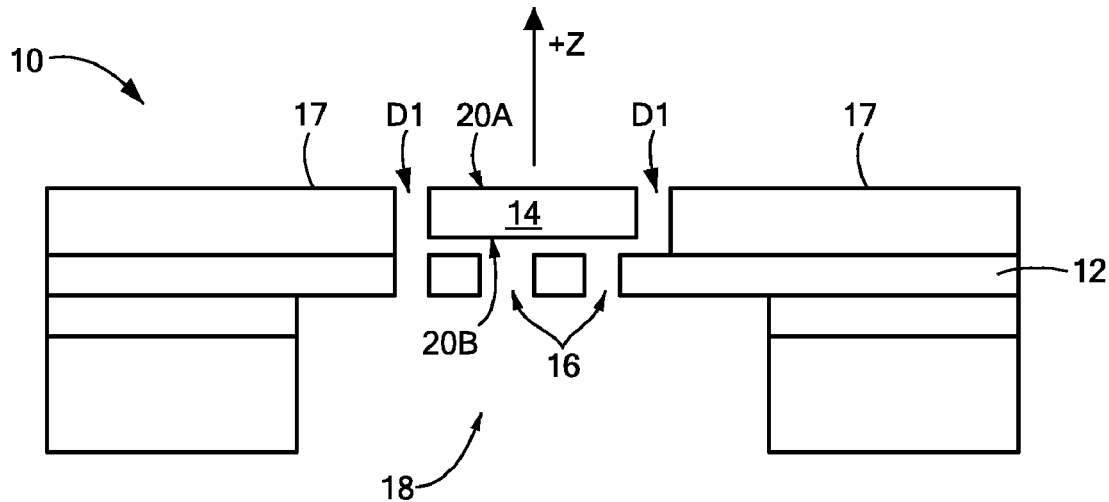
FIG. 1B schematically shows a cross-sectional view of the microphone of FIG. 1A when in the rest position.

FIG. 1A schematically shows a top, perspective view of a microphone 10 (also referred to as a "microphone chip 10") that may be fabricated in accordance with illustrative embodiments of the invention. FIG. 1B schematically shows a cross-section of the same microphone 10 across line B-B of FIG. 1A. Both FIGS. 1A and 1B show the microphone 10 when in the at rest position.

Among other things, the microphone 10 includes a static backplate 12 that supports and forms a capacitor with a flexible diaphragm 14. In illustrative embodiments, the backplate 12 is formed from single crystal silicon (e.g., the top layer of a silicon-on-insulator wafer), while the diaphragm 14 is formed from deposited polysilicon. Other embodiments, however, use other types of materials to form the backplate 12 and the diaphragm 14. For example, a single crystal silicon bulk wafer, or some deposited material may form the backplate 12. In a similar manner, a single crystal silicon bulk wafer, part of a silicon-on-insulator wafer, or some other deposited material may form the diaphragm 14. To facilitate operation, the backplate 12 has a plurality of through-holes 16 that lead to a backside cavity 18. In other embodiments, the backside cavity can also be above the diaphragm, depending on the microphone type (e.g. bottom-ported).

Springs 19 movably connect the diaphragm 14 to the stationary portion 17 of the microphone 10, which includes a substrate. Audio signals cause the diaphragm 14 to vibrate, thus producing a changing capacitance. On-chip or off-chip circuitry (not shown) receives (via contacts 15) and converts this changing capacitance into electrical signals that can be further processed. Although the diaphragm may be flexible, the diaphragm behaves as a rigid structure when compared to the flexibility of the springs.

It should be noted that discussion of the specific microphone 10 shown in FIGS. 1A and 1B is for illustrative purposes only. Other microphone configurations thus may be used with illustrative embodiments of the invention.

As noted above, FIG. 1B schematically shows the microphone 10 at rest. Specifically, the microphone 10 is considered to be at rest when not subjected to any non-negligible incident forces, such as an input audible signal or high force event. When in this state, the diaphragm 14 is considered to be in a rest position. For example, in the embodiment shown, the diaphragm 14 has a top surface 20A that generally shares a plane with the top surface of a stationary portion. This stationary portion is identified in FIG. 1B by reference number 17. It nevertheless should be noted that this relationship is not necessary. Specifically, in other embodiments, the stationary portion 17 may be in a higher or lower plane than that of the top surface 20A of the diaphragm 14. The rest plane can have a thickness that is generally the same thickness as that of the diaphragm 14. As such, at least a portion of the diaphragm resides within a recess formed by the stationary portion when at rest. The stationary portion may have a plurality of recesses and the recesses may be stacked.

While at rest, the diaphragm 14 also forms a space (shown in FIG. 1B as space "D1") between its outer periphery and the stationary portion 17. It is anticipated that, subject to minor variations, this space D1 will remain generally the same size when subjected to normal incident audio signals. This space D1 can be very small (e.g., 1 micrometer) while the diaphragm 14 is generally solid. Such space D1 therefore generally cannot relieve air pressure developing under the diaphragm 14.

The diaphragm 14 as shown at rest resides at least partially in a recess in the stationary portion 17. This at-rest recess can be considered to have a boundary of the back plate 12 and the plane forming the top surface of the stationary portion 17 along with the side walls of the stationary portion. In other embodiments, additional layers of material may form additional stacked recesses. For example, another layer may be placed on top of the stationary portion. This additional layer may form another recess or stacked recess. This recess may be characterized by having a different dimension than the at-rest recess. For example, a dimension of the stacked recess, such as its width, may be larger than the at-rest recess. Thus, if the diaphragm moves above the top surface of the stationary portion 17, without extending above the stacked recess, the diaphragm will still be considered to reside external to the at-rest recess. As used herein, the terms up, down, top, and bottom are used to express relative relationships and not to express absolute directions and embodiments of the invention should not be considered to be limited by these terms.

When subjected to an incident audible signal, the diaphragm 14 generally vibrates back and forth along the Z-axis. As noted above, this vibration produces a variable capacitance that can be converted into an equivalent electrical signal representing the incident audible signal as a result of the change in charge between the diaphragm and the back plate. During this time, the bottom surface 20B of the diaphragm 14 generally remains below the plane defined by the top surface of the stationary portion 17 and thus, generally remains within the at rest plane.

Figure 1C:
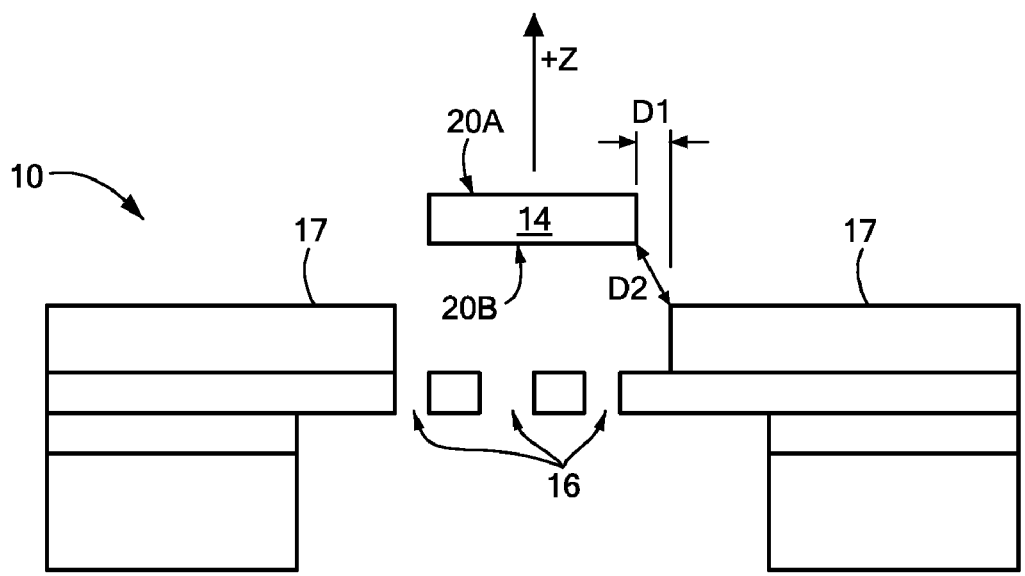
FIG. 1C schematically shows a cross-sectional view of the microphone of FIG. 1A when in an extended position.

In accordance with illustrative embodiments of the invention, the springs 19 permit at least a portion of the bottom surface 20B of the diaphragm 14 to be in a plane that is more positive than the top surface of the stationary portion 17. This relationship, which is shown more distinctly in FIG. 1C, is particular useful when the diaphragm 14 is subjected to a high force event such as the audible signal of a door slam, which may be on the order of 140 dB. As a result, the diaphragm 14 may be spaced a distance D2 from the stationary portion 17 when subjected to a high force event. For example, a high pressure event may occur beneath the diaphragm 14 causing the diaphragm to move and the springs to stretch. As shown in FIG. 1C, this distance D2 is expected to be greater than the at rest distance D1. For example, this distance D2 can be on the order of up to ten times greater than the distance D1. Accordingly, because of this increased distance D2, air can more readily flow out from beneath the diaphragm 14. Therefore, an increase in distance D2 effectively releases the pressure beneath the diaphragm 14. In other words, this new space D2 effectively acts as a pressure release valve to the microphone 10.

FIGS. 2A-4B schematically show a plurality of different spring configurations that may be used to implement illustrative embodiments of the invention. It should be noted that these embodiments are discussed as examples only and not intended to limit various other embodiments of the invention.

Figure 2A:
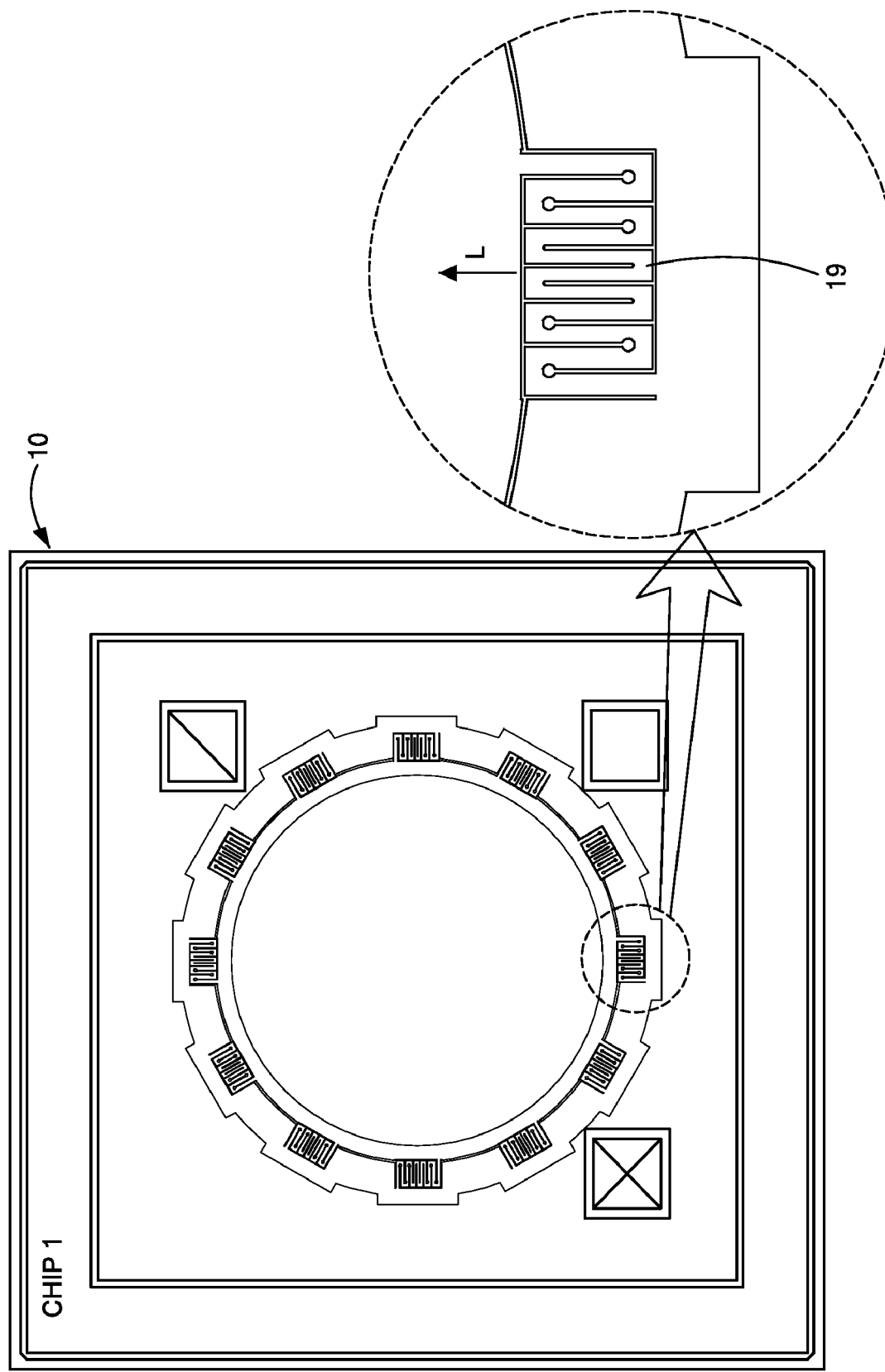
FIGS. 2A and 2B schematically show an embodiment of the invention using a first type of serpentine spring.

FIG. 2A schematically shows one embodiment using serpentine springs 19. As shown, the serpentine springs 19 are placed at twelve locations around the diaphragm 14. The springs 19 are considered to have a long direction (shown by the letter "L" in FIGS. 2A and 2B) that is generally perpendicular to the outer circumferential surface of the diaphragm 14. In addition, as shown in greater detail in FIG. 2B, the springs 19 illustratively have details to further improve their performance. Among other things, each spring 19 may be configured to more evenly distributed stresses across its entire body. The springs on FIGS. 3A and 4A have similar long directions and details.

Figure 2B:
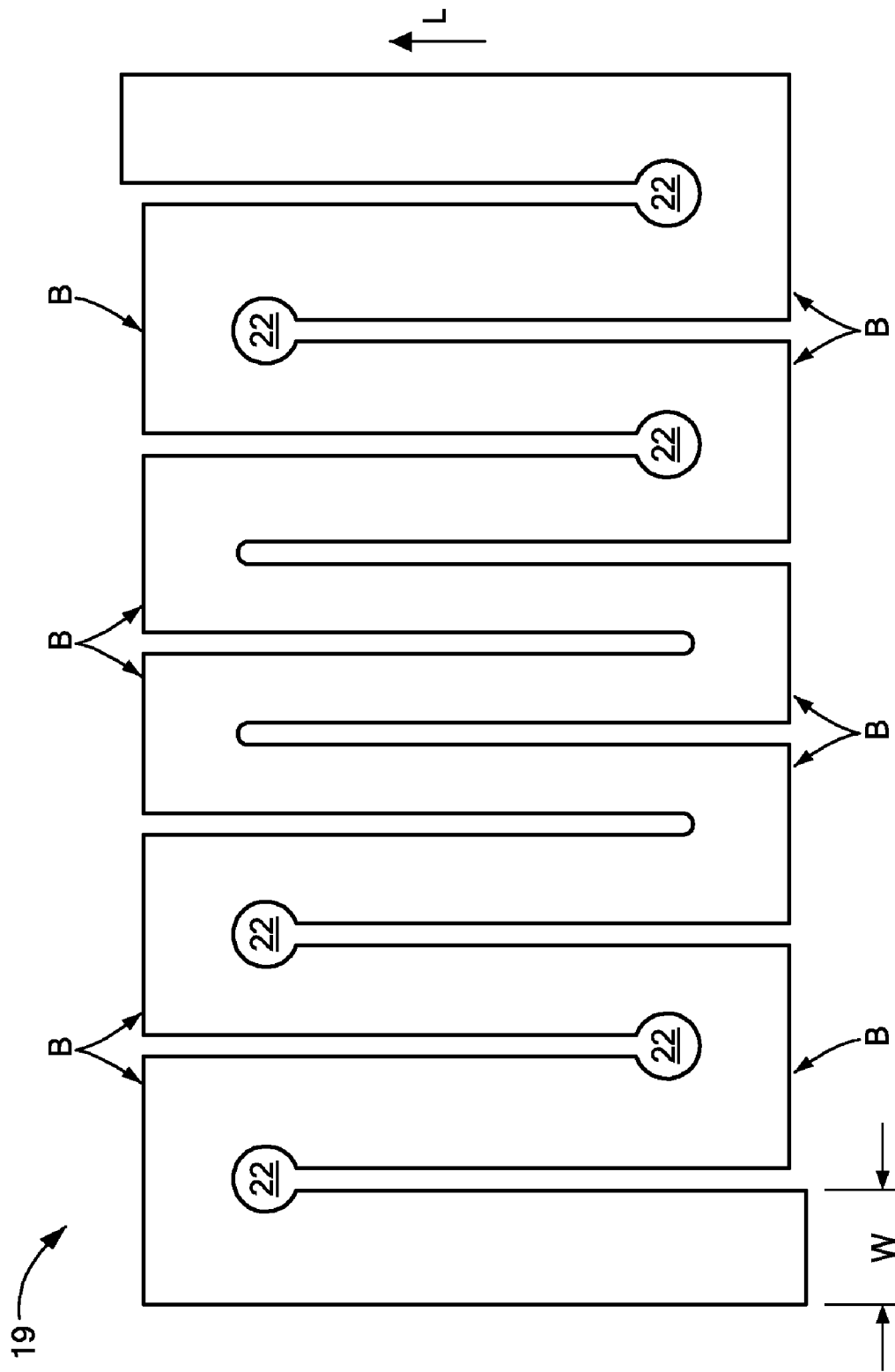

Specifically, as known by those skilled in the art, a serpentine spring may be considered to be a single member having a length dimension and a width dimension (in FIG. 2B, see the letter "W", which shows the width dimension). To assume its basic serpentine structure, however, this single-member is formed to have one or more bends, which are identified in FIG. 2B by the letter "B." Illustrative embodiments of the invention vary the width dimension of this single-member to provide more strength to higher stress areas of the spring. More particularly, it is anticipated that the portions of the spring 19 nearest the diaphragm 14 and stationary portion 17 will be subjected to the highest stresses. Accordingly, these areas are formed to have a greater width than the portions of the spring 19 nearer its middle.

The spring 19 can have a number of other optimizations. For example, stress relief rounding holes 22 can be formed at some of the bends B, and corners can be rounded. The rounding holes and rounding of the corners distribute the forces over a greater area.

Figure 3A:
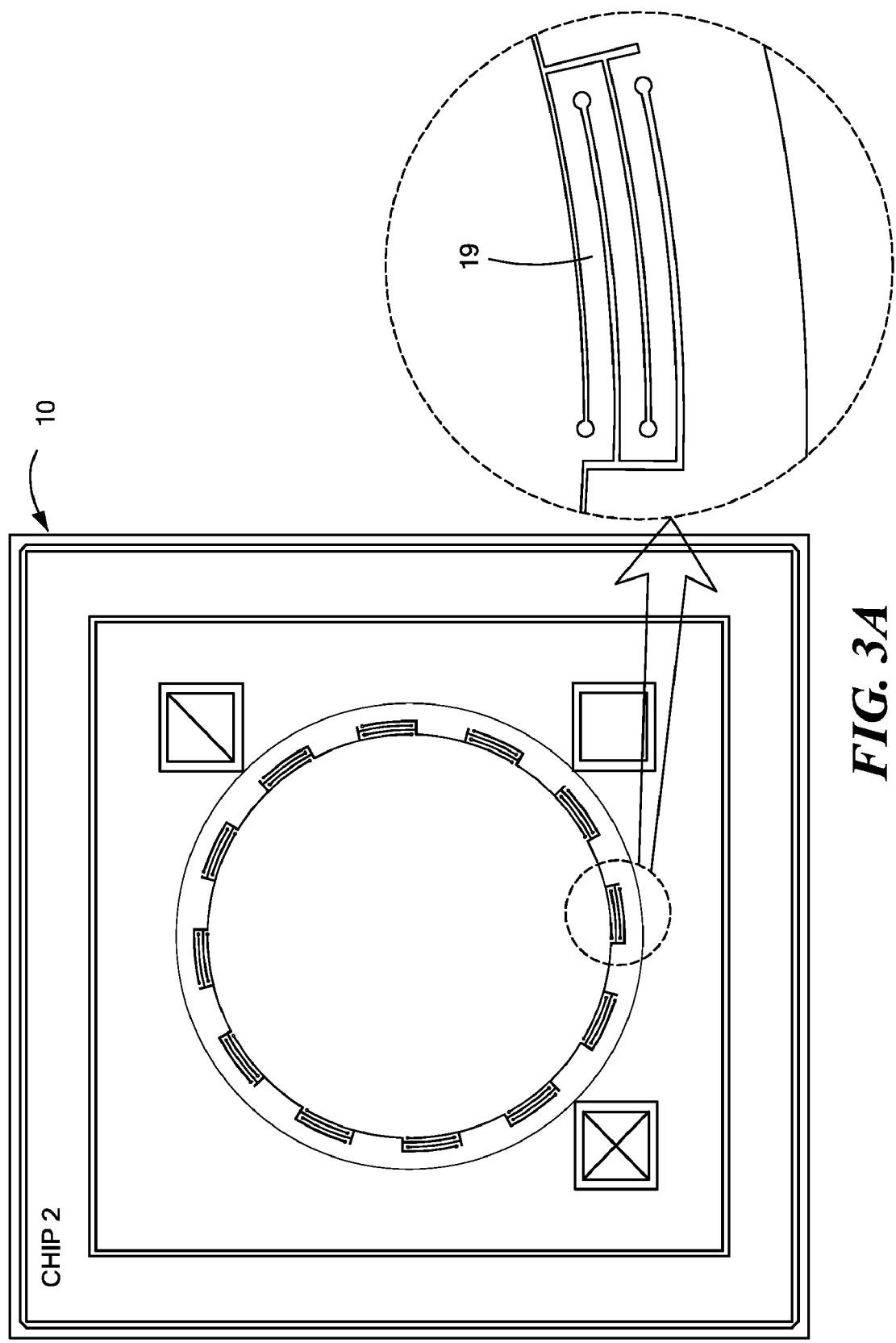
FIGS. 3A and 3B schematically show an embodiment of the invention using a second type of serpentine spring.
Figure 3B:
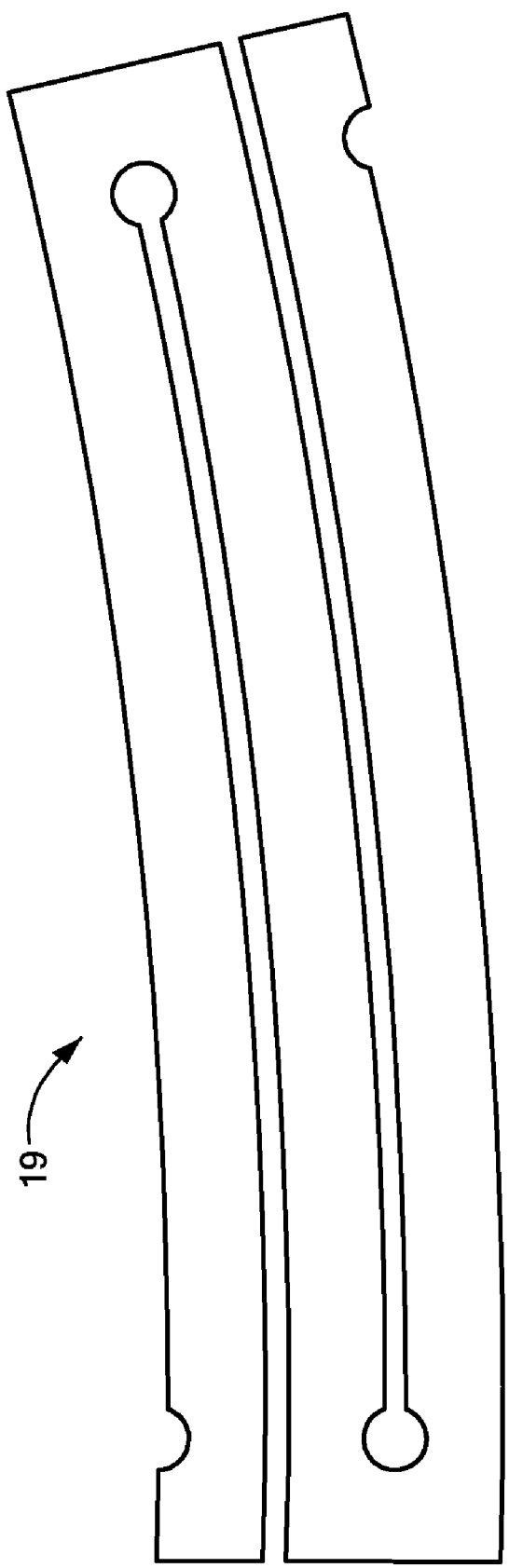

FIGS. 3A and 3B schematically show another embodiment using serpentine springs 19. Unlike the embodiment shown in FIGS. 2A and 2B, this embodiment orients the serpentine springs 19 so that their long dimensions are generally parallel to the outer periphery of the diaphragm 14.

Figure 4A:
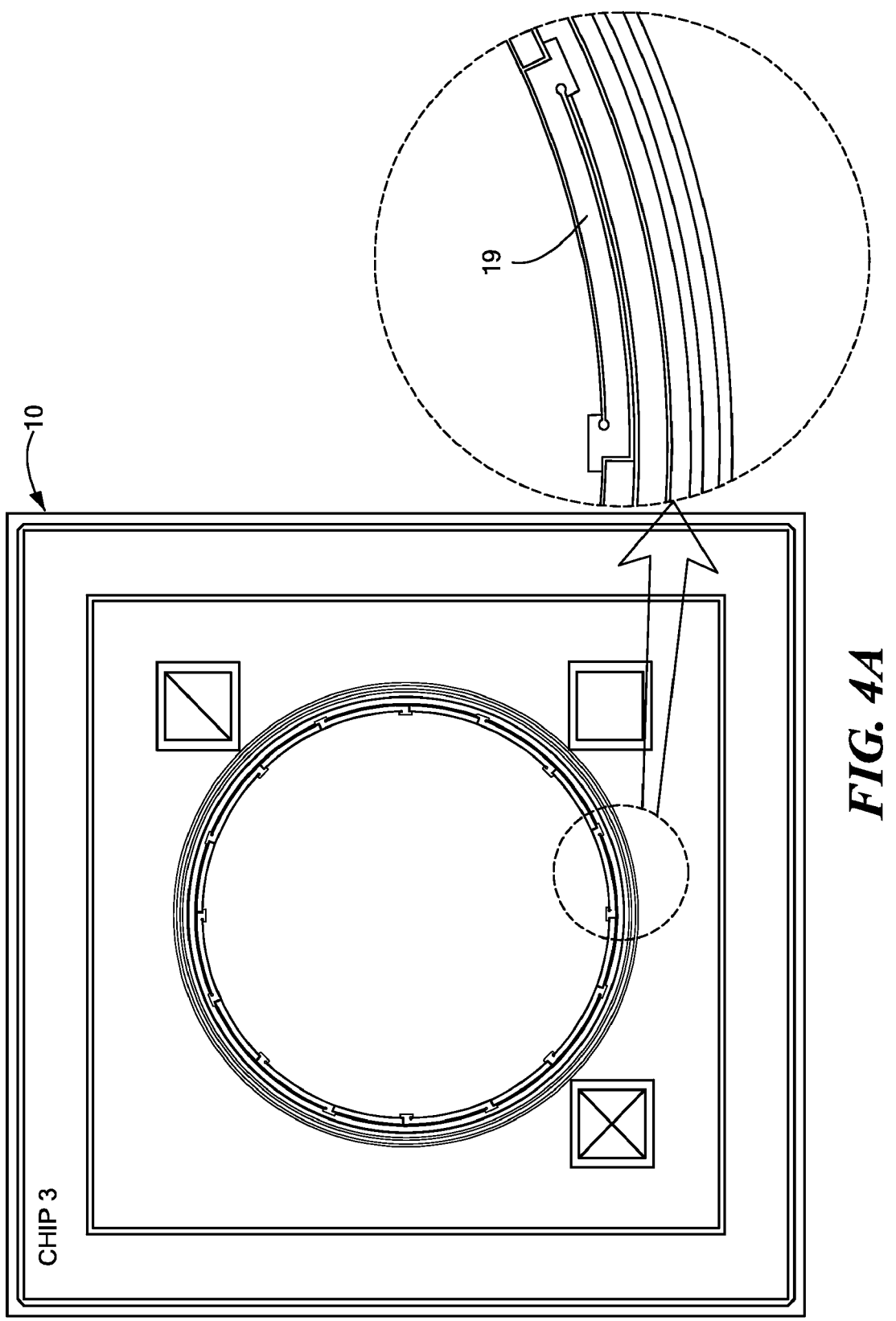
FIGS. 4A and 4B schematically show an embodiment of the invention using another type of spring.
Figure 4B:
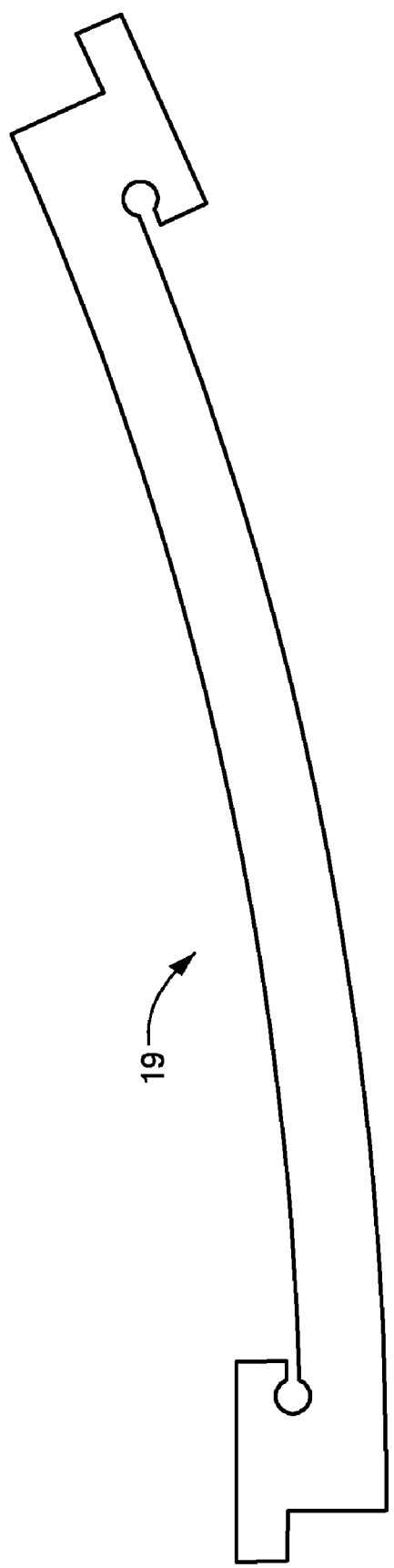

Other embodiments use springs 19 that are not serpentine shaped. For example, FIGS. 4A and 4B schematically show an embodiment using generally straight springs 19 each having a major dimension that is generally parallel to the outer surface of the diaphragm 14.

It should be noted that various aspects of the springs 19 shown in FIGS. 2A-4B may be combined to provide the desired performance. Discussion of these features alone therefore is not intended to mean that they cannot be combined.

Of course, those skilled in the art should understand that a number of other factors are taken into account when fabricating the springs 19. Specifically, those skilled in the art are expected to form the springs 19 to have a collective spring constant. Factors that contribute to determining the spring constant include the frequency bandwidth to be measured, the maximum sound pressure level, and the acceleration sensitivity of the diaphragm. In addition, factors such as immunity to breakage caused by high mechanical and/or acoustic pressure and the electrostatic pull-in stability caused by the bias voltage need to be accounted for. In one embodiment, for example, the collection of springs has a collective spring constant of 7.8N/m. This spring constant provides sensitivity (on the order of −36 dBA ref. 1V/Pa for a 4V bias voltage) of an audio signal for a diaphragm of approximately 500 µm in diameter that may move a few tenths of a micrometer under normal operation and approximately 7-10 µm out of the rest plane under a high force event. Other factors, in addition to the factors already mentioned, that contribute to sensitivity include the sensing gap distance between the back of the diaphragm and the back plate.

To fabricate the springs, in addition to taking into account the factors discussed above, those skilled in the art also consider other factors, such as materials used to form the springs 19, and the number of springs 19 used. In fact, some embodiments may use two or more different types of springs 19 around the periphery of the diaphragm 14.

Among other arrangements, illustrative embodiments of the invention should prove to be particularly useful when the microphone 10 is mounted directly to the input aperture of a microphone package. See, for example, U.S. patent application Ser. No. 11/947,192 (filed on Nov. 29, 2007, naming Carl M. Roberts and Kieran P. Harney as inventors, entitled, "Microphone System with Silicon Microphone Secured to Package Lid," which shows such a mounting configuration. The disclosure of that provisional patent application is incorporated herein, and its entirety, by reference.

Although the above discussion discloses various exemplary embodiments of the invention, it should be apparent that those skilled in the art can make various modifications that will achieve some of the advantages of the invention without departing from the true scope of the invention.

What is claimed is:

1. A method for operation of a microphone chip, the method comprising:

providing a microphone having a diaphragm coupled to a stationary portion by a plurality of springs wherein in a rest position, in the absence of an audio signal, at least a portion of the diaphragm resides internal to a recess within the stationary portion, and wherein when the diaphragm is in the rest position, a gap defining a first distance is formed between the outer periphery of the diaphragm and the stationary portion;

providing an input audio signal to the diaphragm of the microphone;

as a result of the input audio signal, moving the diaphragm to a position external to the internal recess providing for pressure relief, wherein when the diaphragm is in the position external to the recess, the gap between the outer periphery of the diaphragm and the stationary portion defines a second distance that is greater than the first distance, and wherein the plurality of springs are capable of returning the diaphragm from the position external to the internal recess to the rest position internal to the recess.

2. The method according to claim 1 wherein the stationary portion has a top surface and the diaphragm has a bottom surface and the bottom surface of the diaphragm resides in a plane that is below the top surface of the stationary portion when no audio signal is provided to the bottom side of the diaphragm and wherein when the input audio signal is provided to the diaphragm the bottom surface of the diaphragm resides in a plane that is above the top surface of the stationary portion.

3. The method according to claim 1 wherein the plurality of springs includes at least one serpentine spring.

4. A microphone comprising:

a stationary portion having at least one internal recess;

a movable diaphragm having a rest position wherein at least a portion of the movable diaphragm resides within the internal recess when the movable diaphragm is in the rest position, and wherein when the diaphragm is in the rest position, a gap defining a first distance is formed between the outer periphery of the diaphragm and the stationary portion; and a set of springs movably coupling the diaphragm and the stationary portion, the diaphragm moving external to the internal recess, wherein when the diaphragm is in the position external to the recess, the gap between the outer periphery of the diaphragm and the stationary portion defines a second distance that is greater than the first distance, the set of springs being capable of returning the diaphragm from external to the internal recess to the rest position internal to the recess.

5. A microphone according to claim 4 wherein the set of springs includes at least one serpentine spring.

6. A microphone according to claim 4 wherein the set of springs includes at least one spring having a pressure relief feature.

7. A microphone according to claim 4 wherein the set of springs includes at least one spring having a varying width or stress relief rounding holes.

8. A microphone according to claim 4 wherein the set of springs includes a generally straight spring.

9. A microphone according to claim 4 wherein the set of springs has two or more springs.

10. A microphone according to claim 4 wherein the stationary portion is silicon.

11. A microphone according to claim 4 wherein the diaphragm is external to the recess when subjected to a high force event.

12. The microphone according to claim 4, further comprising:
a back plate forming a capacitor with the diaphragm creating an electrical output signal in response to the audio input signal.

13. A microphone according to claim 12 wherein the back plate is single crystal silicon.

14. A microphone according to claim 4, wherein the diaphragm is polysilicon.

15. A microphone chip comprising:
a diaphragm having a first surface and a side;
a stationary portion having a side;
a plurality of springs coupled to the diaphragm and the stationary portion wherein a gap having a dimension exists between the side of the stationary portion and the side of the diaphragm and wherein the springs may extend under a force presented by an audio input signal to the first surface of the diaphragm, so as to increase the dimension of the gap, wherein when the diaphragm is in the position external to the recess, the gap between the outer periphery of the diaphragm and the stationary portion defines a second distance that is greater than the first distance, and wherein the plurality of springs are capable of returning the diaphragm from the position external to the internal recess to the rest position internal to the recess.

16. The microphone chip according to claim 15, further comprising:
a back plate forming a capacitor with the diaphragm creating an electrical output signal in response to the audio input signal.

17. A microphone chip according to claim 16, wherein the back plate has a one or more holes that allow the audible input signal to pass there through and contact the diaphragm.

18. A microphone chip according to claim 15 wherein the plurality of springs stretch in a plane that is substantially perpendicular to the first side of the diaphragm.

19. A microphone chip according to claim 15 wherein the back plate is single crystal silicon.

20. A microphone chip according to claim 15 wherein the diaphragm is polysilicon.

21. A microphone chip according to claim 15 wherein the plurality of springs includes at least two serpentine springs.

22. A microphone chip according to claim 15 wherein the plurality of springs includes at least one spring having a pressure relief feature.

23. A microphone chip according to claim 15 wherein the plurality of springs includes at least one spring having a varying width or stress relief rounding holes.

24. A microphone chip according to claim 15 wherein the set of springs includes a generally straight spring.

* * * * *